United States Patent
Kamei et al.

(10) Patent No.: US 7,986,495 B2
(45) Date of Patent: Jul. 26, 2011

(54) PRINTED CIRCUIT BOARD HAVING A LAYERED SIGNAL LINE PAIR, A SUSPENSION BOARD

(75) Inventors: Katsutoshi Kamei, Ibaraki (JP); Voonyee Ho, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/369,029

(22) Filed: Feb. 11, 2009

(65) Prior Publication Data

US 2009/0211787 A1 Aug. 27, 2009

Related U.S. Application Data

(66) Substitute for application No. 61/037,005, filed on Mar. 17, 2008.

(30) Foreign Application Priority Data

Feb. 27, 2008 (JP) .................................. 2008-046680

(51) Int. Cl.
*G11B 21/16* (2006.01)
(52) U.S. Cl. ..................... 360/246; 360/245.9; 174/250; 174/251; 361/770
(58) Field of Classification Search ............... 360/245.9, 360/246, 264.2, 245.8, 244, 240, 266.3; 361/770
See application file for complete search history.

(56) References Cited

U.S. PATENT DOCUMENTS

| | | | | |
|---|---|---|---|---|
| 5,634,208 A | * | 5/1997 | Nishikawa et al. | 455/327 |
| 5,995,328 A | * | 11/1999 | Balakrishnan | 360/245.9 |
| 6,493,190 B1 | * | 12/2002 | Coon | 360/245.9 |
| 6,963,471 B2 | * | 11/2005 | Arai et al. | 360/246 |
| 7,019,959 B2 | * | 3/2006 | Chua | 361/329 |
| 2004/0070884 A1 | | 4/2004 | Someya et al. | |
| 2006/0092572 A1 | * | 5/2006 | Kiyono | 360/245.9 |
| 2007/0133128 A1 | * | 6/2007 | Arai | 360/245.9 |

FOREIGN PATENT DOCUMENTS

JP 2004-133988 A 4/2004

* cited by examiner

*Primary Examiner* — Tuan T Dinh
*Assistant Examiner* — Steven Sawyer
(74) *Attorney, Agent, or Firm* — Panitch Schwarze Belisario & Nadel LLP

(57) ABSTRACT

A first insulating layer is formed on a suspension body, and a write wiring trace and a read wiring trace are formed on the first insulating layer. A second insulating layer is formed on the first insulating layer so as to cover the wiring traces. A write wiring trace and a read wiring trace are formed on the second insulating layer. A third insulating layer is formed on the second insulating layer so as to cover the wiring traces. The width of the wiring trace is larger than the width of the wiring trace, and the width of the wiring trace is larger than the width of the wiring trace.

12 Claims, 6 Drawing Sheets

PRINTED CIRCUIT BOARD HAVING A LAYERED SIGNAL LINE PAIR, A SUSPENSION BOARD

BACKGROUND OF THE INVENTION

1. Field of the Invention

The present invention relates to a printed circuit board.

2. Description of the Background Art

An actuator is used in a drive such as a hard disk drive. Such an actuator includes an arm arranged rotatably with respect to a rotation shaft and a suspension board used for a magnetic head that is attached to the arm. The suspension board is a printed circuit board for aligning the magnetic head with a desired track of a magnetic disk.

FIG. 6 is a vertical sectional view showing one example of a conventional suspension board. In the suspension board 900 of FIG. 6, an insulating layer 903 is formed on a metal substrate 902. A pair of write conductors W1, W2 and a pair of read conductors R1, R2 are formed so as to align in sequence on the insulating layer 903.

One ends of the conductors W1, W2, R1, R2 are connected to a magnetic head (not shown). The other ends of the conductors W1, W2, R1, R2 are electrically connected to a write electrical circuit (not shown) and a read electrical circuit (not shown), respectively.

When a write current flows through the write conductors W1, W2, induced electromotive forces are generated in the read conductors R1, R2 by electromagnetic induction in the suspension board 900.

Here, the distance between the write conductors W1, W2 and the read conductor R1 is smaller than the distance between the write conductors W1, W2 and the read conductor R2. This causes a difference in the induced electromotive forces generated in the read conductors R1, R2. As a result, a current flows through the read conductors R1, R2. That is, a crosstalk occurs between the write conductors W1, W2 and the read conductors R1, R2.

Therefore, JP 2004-133988 A proposes a printed circuit board shown in FIG. 7 for preventing occurrence of the crosstalk between the write conductors W1, W2 and the read conductors R1, R2.

FIG. 7 is a vertical sectional view showing another example of the conventional suspension board. In the suspension board 910, a first insulating layer 904 is formed on the metal substrate 902. The write conductor W2 and the read conductor R2 are formed so as to be spaced apart from each other by a distance L1 on the first insulating layer 904.

A second insulating layer 905 is formed on the first insulating layer 904 so as to cover the write conductor W2 and the read conductor R2. On the second insulating layer 905, the write conductor W1 is formed at a position above the read conductor R2, and the read conductor R1 is formed at a position above the write conductor W2.

The distance between the read conductor R1 and the write conductor W2 that are positioned one above the other and the distance between the read conductor R2 and the write conductor W1 that are positioned one above the other are L2, respectively.

In the suspension board 910 of FIG. 7 having the foregoing configuration, the distances between the write conductors W1, W2 and the read conductor R1 are substantially equal to the distances between the write conductors W1, W2 and the read conductor R2, respectively. Accordingly, it is considered that the magnitudes of the induced electromotive forces generated in the read conductors R1, R2 are substantially equal when the write current flows through the write conductors W1, W2.

In the suspension boards 900, 910 shown in FIGS. 6 and 7, impedances of the conductors W1, W2, R1, R2 vary depending on the magnitudes of coupling capacitances between the conductors W1, W2, R1, R2 and the metal substrate 902.

Here, the distance between the write conductor W1 and the metal substrate 902 is different from the distance between the write conductor W2 and the metal substrate 902 in the suspension board 910 of FIG. 7. Moreover, the distance between the read conductor R1 and the metal substrate 902 is different from the distance between the read conductor R2 and the metal substrate 902.

In this case, the coupling capacitance between the write conductor W1 and the metal substrate 902 is different from the coupling capacitance between the write conductor W2 and the metal substrate 902. Moreover, the coupling capacitance between the read conductor R1 and the metal substrate 902 is different from the coupling capacitance between the read conductor R2 and the metal substrate 902.

Therefore, differences occur in the impedances of the write conductor W1 and the write conductor W2 and in the impedances of the read conductor R1 and the read conductor R2 in the configuration of the suspension board 910. This may cause a transmission error of a differential signal through the write conductors W1, W2 and a transmission error of a differential signal through the read conductors R1, R2.

SUMMARY OF THE INVENTION

An object of the present invention is to provide a printed circuit board in which a signal transmission error can be sufficiently prevented.

(1) According to one aspect of the present invention, a printed circuit board includes a conductive substrate, a first insulating layer formed on the conductive substrate, a first wiring trace formed on the first insulating layer, a second insulating layer formed on the first insulating layer so as to cover the first wiring trace, a second wiring trace formed on the second insulating layer, and a third insulating layer formed on the second insulating layer so as to cover the second wiring trace, wherein the first and second wiring traces constitute a first signal line pair, and a width of the second wiring trace is larger than a width of the first wiring trace.

In the printed circuit board, the first insulating layer is formed on the conductive substrate, and the first wiring trace is formed on the first insulating layer. Moreover, the second insulating layer is formed on the first insulating layer so as to cover the first wiring trace, and the second wiring trace is formed on the second insulating layer. Then, the third insulating layer is formed on the second insulating layer so as to cover the second wiring trace. The width of the second wiring trace is set larger than the width of the first wiring trace. In such a configuration, the first and second wiring traces constitute the first signal line pair.

Here, the distance between the first wiring trace and the conductive substrate is shorter than the distance between the second wiring trace and the conductive substrate in the printed circuit board. Meanwhile, the width of the second wiring trace is larger than the width of the first wiring trace. This causes a capacitance of the first wiring trace with respect to the conductive substrate and a capacitance of the second wiring trace with respect to the conductive substrate to be substantially equal to each other.

In this case, occurrence of a difference between an impedance of the first wiring trace and an impedance of the second wiring trace is prevented. This sufficiently prevents a signal transmission error caused by imbalance of the first signal line pair.

(2) The widths of the first and second wiring traces may be set such that an impedance of the first wiring trace and an impedance of the second wiring trace are substantially equal to each other.

In this case, the signal transmission error caused by the imbalance of the first signal line pair can be reliably prevented.

(3) The printed circuit board may further include a third wiring trace formed on the first insulating layer at a distance from the first wiring trace, and a fourth wiring trace formed on the second insulating layer at a distance from the second wiring trace, wherein the third and fourth wiring traces may constitute a second signal line pair, and a width of the fourth wiring trace may be larger than a width of the third wiring trace.

In this case, signals representing different types of information can be transmitted using the first signal line pair and the second signal line pair.

In addition, since the width of the fourth wiring trace is larger than the width of the third wiring trace, a capacitance of the third wiring trace with respect to the conductive substrate and a capacitance of the fourth wiring trace with respect to the conductive substrate are substantially equal to each other. This prevents occurrence of a difference between an impedance of the third wiring trace and an impedance of the fourth wiring trace. As a result, a signal transmission error caused by imbalance of the second signal line pair can be reliably prevented.

(4) The widths of the third and fourth wiring traces may be set such that an impedance of the third wiring trace and an impedance of the fourth wiring trace are substantially equal to each other.

In this case, the signal transmission error caused by the imbalance of the second signal line pair can be reliably prevented.

(5) The printed circuit board may further include a fifth wiring trace formed between the first wiring trace and the third wiring trace on the first insulating layer.

In this case, an upper surface of a region, between the first wiring trace and the third wiring trace, of the second insulating layer can be prevented from bending in a concave shape at the time of formation of the second insulating layer. This prevents generation of defects in the second and fourth wiring traces at the time of formation of the second and fourth wiring traces on the second insulating layer. Thus, the yield of the printed circuit board can be improved.

(6) The printed circuit board may further include a head that is provided in the conductive substrate and reads/writes a signal, wherein the first, second, third and fourth wiring traces are electrically connected to the head.

In this case, the printed circuit board can be used as a suspension board of a drive such as a hard disk drive.

Then, information can be written and read in/from a magnetic disk by the first and second wiring traces constituting the first signal line pair and the third and fourth wiring traces constituting the second signal line pair.

In this case, since the signal transmission error is sufficiently prevented in the first signal line pair and the second signal line pair, occurrence of an error at the time of writing and reading is reliably prevented.

According to the present invention, the signal transmission error can be sufficiently prevented.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
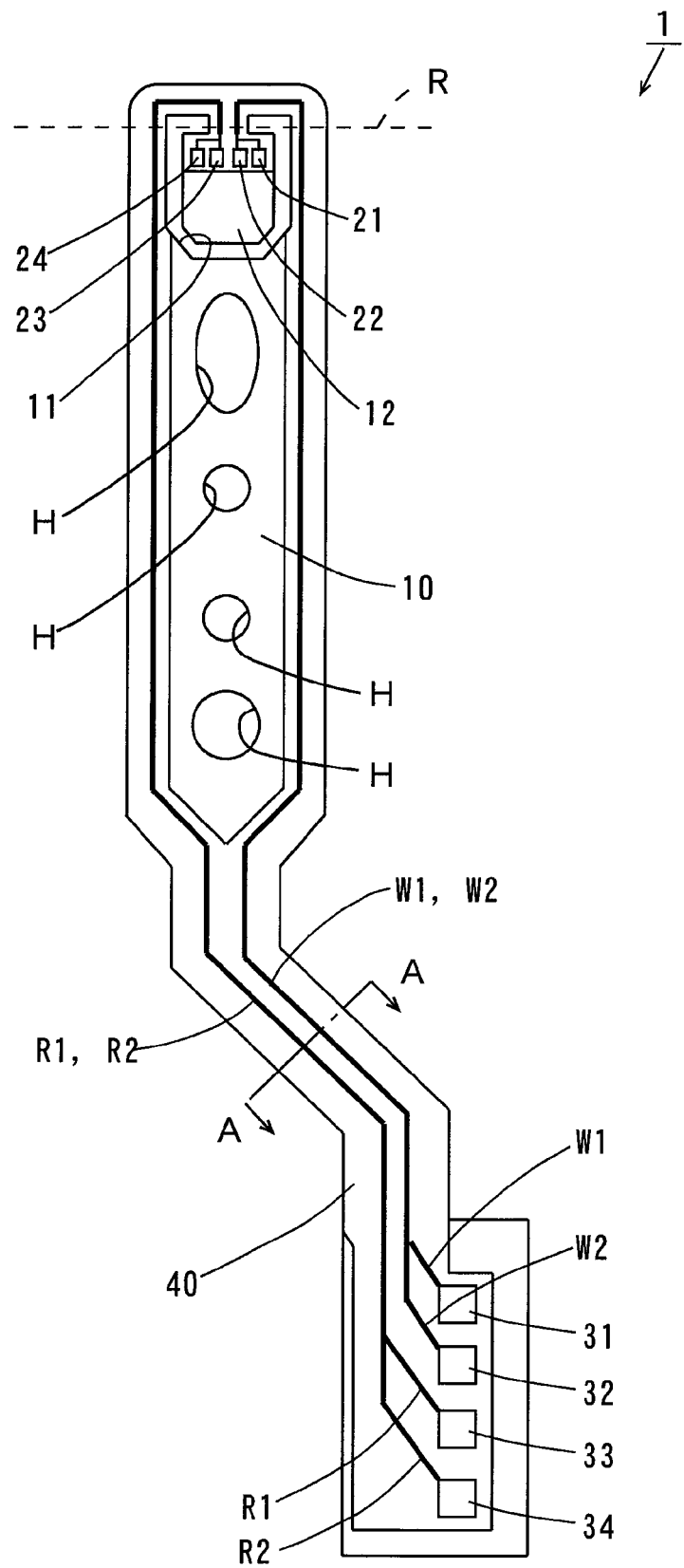
FIG. 1 is a plan view of a suspension board according to a first embodiment of the present invention.

Hereinafter, a printed circuit board and a method of manufacturing the same according to embodiments of the present invention will be described while referring to the drawings. The configuration of a suspension board used in an actuator of a hard disk drive and a method of manufacturing the same will be described as an example of the printed circuit board according to the embodiments of the present invention.

First Embodiment (1) Configuration of the Suspension Board

Figure 2:
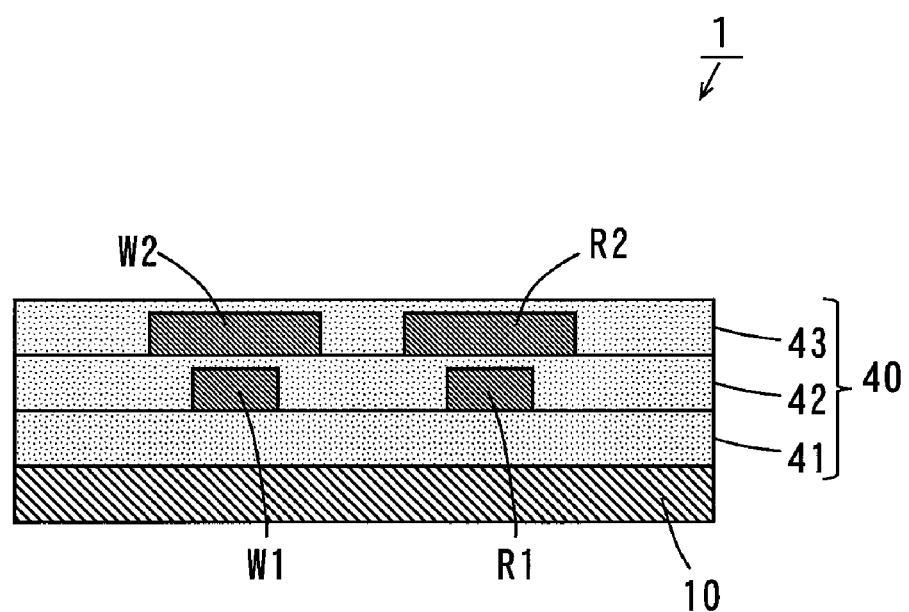
FIG. 2 is a vertical sectional view of the suspension board taken along the line A-A of FIG. 1.

FIG. 1 is a top view of the suspension board according to a first embodiment of the present invention, and FIG. 2 is a vertical sectional view of the suspension board 1 taken along the line A-A of FIG. 1.

As shown in FIG. 1, the suspension board 1 includes a suspension body 10 formed of a long-sized metal substrate. Write wiring traces W1, W2 and read wiring traces R1, R2 are formed on the suspension body 10 as indicated by the thick solid lines.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another by the wiring traces W1, W2, R1, R2, respectively. A plurality of holes H are formed in the suspension body 10.

In the suspension board 1, an insulating layer 40 composed of a plurality of layers is formed in a region where the plurality of wiring traces W1, W2, R1, R2 are formed so as to cover each of the wiring traces W1, W2, R1, R2.

As shown in FIG. 2, the insulating layer 40 is composed of first, second and third insulating layers 41, 42, 43. The first insulating layer 41 is formed on the suspension body 10.

The write wiring trace W1 for writing information in a magnetic disk that is not shown and the read wiring trace R1 for reading information from the magnetic disk are formed on the first insulating layer 41. The write wiring trace W1 and the read wiring trace R1 are aligned in parallel with each other at a predetermined distance.

Moreover, the second insulating layer 42 is formed on the first insulating layer 41 so as to cover the write wiring trace W1 and the read wiring trace R1.

On the second insulating layer 42, the write wiring trace W2 is formed at a position above the write wiring trace W1, and the read wiring trace R2 is formed at a position above the read wiring trace R1. The write wiring trace W2 is formed so as to have a larger width than that of the write wiring trace W1, and the read wiring trace R2 is formed so as to have a larger width than that of the read wiring trace R1.

In addition, the third insulating layer 43 is formed on the second insulating layer 42 so as to cover the write wiring trace W2 and the read wiring trace R2.

In the hard disk, which is not shown, including the suspension board 1, a current flows through the pair of write wiring traces W1, W2 at the time of writing information in the magnetic disk. Moreover, the current flows through the pair of read wiring traces R1, R2 at the time of reading information from the magnetic disk.

(2) Manufacture of the Suspension Board

The method of manufacturing the suspension board 1 will be described. Description of respective steps of forming the tongue 12, the electrode pads 21 to 24, 31 to 34 and the holes H of FIG. 1 is omitted in the following description.

Figure 3:
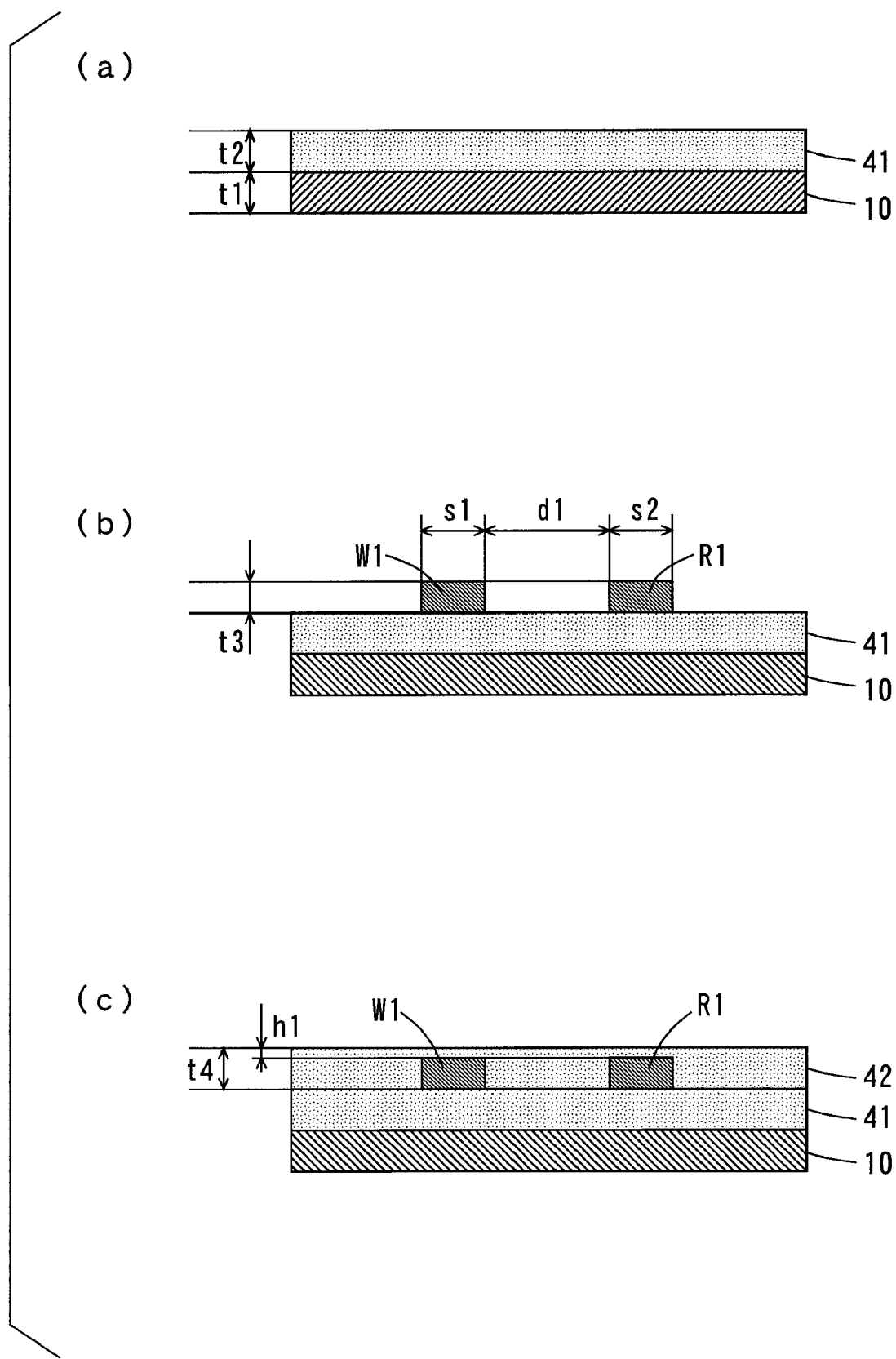
FIG. 3 is a diagram showing steps of manufacturing the suspension board according to the first embodiment.
Figure 4:
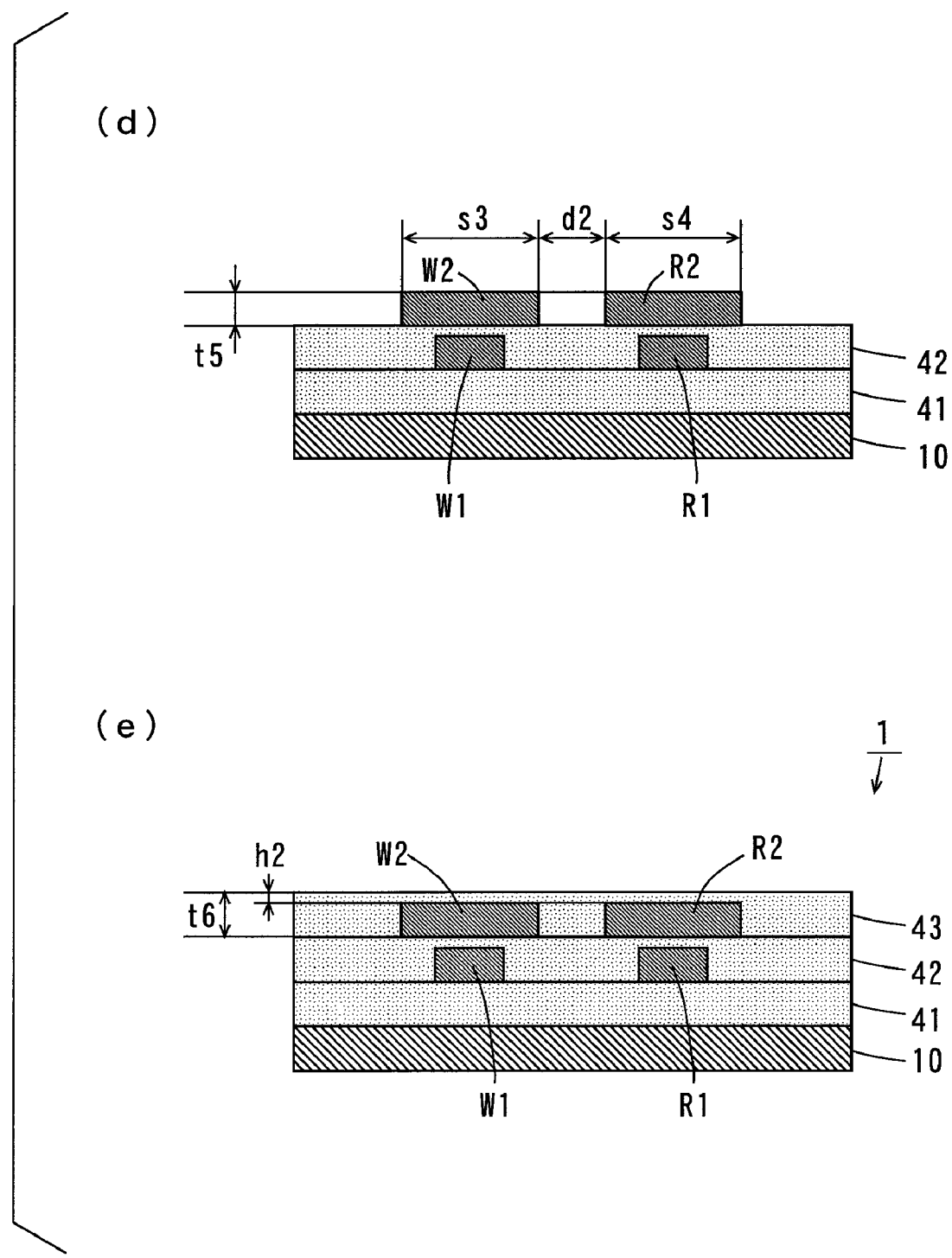
FIG. 4 is a diagram showing steps of manufacturing the suspension board according to the first embodiment.

FIGS. 3 and 4 are vertical sectional views showing steps of manufacturing the suspension board 1 according to the present embodiment. First, the long-sized substrate made of stainless steel (SUS) is prepared as the suspension body 10 as shown in FIG. 3 (a). Then, the first insulating layer 41 mainly made of polyimide resin is formed on the suspension body 10.

A long-sized substrate made of another metal material such as aluminum (Al) instead of stainless steel may be used as the suspension body 10. The thickness t1 of the suspension body 10 is not less than 5 μm and not more than 50 μm, for example, and preferably not less than 10 μm and not more than 30 μm. The thickness t2 of the first insulating layer 41 is not less than 1 μm and not more than 20 μm, for example, and preferably not less than 2 μm and not more than 15 μm.

Then, the write wiring trace W1 and the read wiring trace R1 made of copper (Cu) are formed on the first insulating layer 41 as shown in FIG. 3 (b). The write wiring trace W1 and the read wiring trace R1 are formed in parallel with each other at the predetermined distance.

The write wiring trace W1 and the read wiring trace R1 may be formed using a semi-additive method, for example, and may be formed using another method such as a subtractive method.

The write wiring trace W1 and the read wiring trace R1 can be formed using another metal such as gold (Au) and aluminum or an alloy such as a copper alloy and an aluminum alloy, not limited to copper.

The thickness t3 of the write wiring trace W1 and the read wiring trace R1 is not less than 1 μm and not more than 20 μm, for example, and preferably not less than 2 μm and not more than 13 μm. Each of the widths s1, s2 of the write wiring trace W1 and the read wiring trace R1 is not less than 5 μm and not more than 30 μm, for example, and preferably not less than 10 μm and not more than 25 μm.

The distance d1 between the write wiring trace W1 and the read wiring trace R1 is not less than 5 μm and not more than 100 μm, for example, and preferably not less than 10 μm and not more than 60 μm.

In the above-described configuration, thin metal films may be formed between the first insulating layer 41 and the write wiring trace W1 and between the first insulating layer 41 and the read wiring trace R1, respectively. In this case, adhesion between the first insulating layer 41 and the write wiring trace W1 and between the first insulating layer 41 and the read wiring trace R1 is improved.

After that, the second insulating layer 42 mainly made of polyimide resin is formed on the first insulating layer 41 so as to cover the write wiring trace W1 and the read wiring trace R1 as shown in FIG. 3 (c).

The thickness t4 of the second insulating layer 42 is not less than 4 μm and not more than 25 μm, for example, and preferably not less than 7 μm and not more than 17 μm. The thickness h1 between upper surfaces of the write wiring trace W1 and the read wiring trace R1 and an upper surface of the second insulating layer 42 is not less than 1 μm and not more than 5 μm, for example.

Next, the write wiring trace W2 and the read wiring trace R2 made of copper are formed on the second insulating layer 42 as shown in FIG. 4 (d). Here, the write wiring trace W2 and the read wiring trace R2 are formed at positions above the write wiring trace W1 and the read wiring trace R1, respectively.

This causes the upper surface of the write wiring trace W1 to be opposite to a lower surface of the write wiring trace W2, and causes the upper surface of the read wiring trace R1 to be opposite to a lower surface of the read wiring trace R2.

The write wiring trace W2 and the read wiring trace R2 are formed in the same manner as the wiring traces W1, R1. The write wiring trace W2 and the read wiring trace R2 can be formed using another metal such as gold (Au) and aluminum or an alloy such as a copper alloy and an aluminum alloy, not limited to copper.

The thickness t5 of the write wiring trace W2 and the read wiring trace R2 is not less than 1 μm and not more than 20 μm, for example, and preferably not less than 2 μm and not more than 13 μm. The distance d2 between the write wiring trace W2 and the read wiring trace R2 is not less than 5 μm and not more than 100 μm, for example, and preferably not less than 10 μm and not more than 30 μm.

The widths s3, s4 of the write wiring trace W2 and the read wiring trace R2 are set larger than the widths s1, s2 of the write wiring trace W1 and the read wiring trace R1. Each of the widths s3, s4 is not less than 20 μm and not more than 200 μm, for example, and preferably not less than 30 μm and not more than 100 μm.

Note that the widths s1, s3 are set such that an impedance of the write wiring trace W1 and an impedance of the write wiring trace W2 are equal to each other, and the widths s2, s4 are set such that an impedance of the read wiring trace R1 and an impedance of the read wiring trace R2 are equal to each other in the present embodiment.

Specifically, the widths s1, s3 are set such that a capacitance of the write wiring trace W1 with respect to the suspension body 10 is substantially equal to a capacitance of the write wiring trace W2 with respect to the suspension body 10. In addition, the widths s2, s4 are set such that a capacitance of the read wiring trace R1 with respect to the suspension body 10 is substantially equal to a capacitance of the read wiring trace R2 with respect to the suspension body 10.

Thin metal films may be formed between the second insulating layer 42 and the write wiring trace W2 and between the second insulating layer 42 and the read wiring trace R2, respectively. In this case, adhesion between the second insulating layer 42 and the write wiring trace W2 and between the second insulating layer 42 and the read wiring trace R2 is improved.

Finally, the third insulating layer 43 mainly made of polyimide resin is formed on the second insulating layer 42 so as to cover the write wiring trace W2 and the read wiring trace R2 as shown in FIG. 4 (e).

The thickness t6 of the third insulating layer 43 is not less than 4 μm and not more than 25 μm, for example, and preferably not less than 7 μm and not more than 17 μm. The thickness h2 between upper surfaces of the write wiring trace W2 and the read wiring trace R2 and an upper surface of the third insulating layer 43 is not less than 1 μm and not more than 5 μm, for example.

As described above, the plurality of wiring traces W1, W2, R1, R2 and the insulating layer 40 are formed on the suspension body 10, so that the suspension board 1 is completed.

The widths s1, s2 of the write wiring trace W1 and the read wiring trace R1 may be equal to or different from each other. The widths s3, s4 of the write wiring trace W2 and the read wiring trace R2 may be equal to or different from each other.

Note that the write wiring traces W1, W2 are preferably arranged such that the median line of the write wiring trace W1 overlaps the median line of the write wiring trace W2. In addition, the read wiring traces R1, R2 are preferably arranged such that the median line of the read wiring trace R1 overlaps the median line of the read wiring trace R2.

Another resin material such as epoxy resin, acrylic resin, polyethernitrile resin, polyethersulfone resin, polyethylene terephthalate resin, polyethylene naphthalate resin and polyvinyl chloride resin may be used for the first to third insulating layers 41 to 43 instead of polyimide resin.

Note that the first to third insulating layers 41 to 43 may be formed of different insulating materials or the same insulating material.

An insulting layer made of another insulating material may be further formed between the second insulating layer 42 and the third insulating layer 43. Moreover, an insulating layer made of another insulating material may be further formed between the suspension body 10 and the first insulating layer 41.

(3) Effects

In the suspension board 1 according to the present embodiment, the write wiring trace W2 is arranged above the write wiring trace W1, and the read wiring trace R2 is arranged above the read wiring trace R1. Therefore, the distances between the write wiring traces W1, W2 and the read wiring trace R1 are substantially equal to the distances between the write wiring traces W1, W2 and the read wiring trace R2, respectively. Thus, it is considered that the magnitudes of the induced electromotive forces generated in the read wiring traces R1, R2 are substantially equal when a write current flows through the write wiring traces W1, W2.

This prevents occurrence of the crosstalk between the write wiring traces W1, W2 and the read wiring traces R1, R2.

In addition, the width s3 of the write wiring trace W2 is set larger than the width s1 of the write wiring trace W1 such that the impedance of the write wiring trace W1 and the impedance of the write wiring trace W2 are equal to each other.

Similarly, the width s4 of the read wiring trace R2 is set larger than the width s2 of the read wiring trace R1 such that the impedance of the read wiring trace R1 and the impedance of the read wiring trace R2 are equal to each other.

This reliably prevents a transmission error of a differential signal caused by imbalance of the write wiring traces W1, W2 and prevents a transmission error of a differential signal caused by imbalance of the read wiring traces R1, R2.

This results in reliable prevention of an error at the time of writing and reading information in/from the magnetic disk in the hard disk, which is not shown, including the suspension board 1.

Second Embodiment

A suspension board according to a second embodiment is different from the suspension board 1 according to the first embodiment in the following points.

Figure 5:
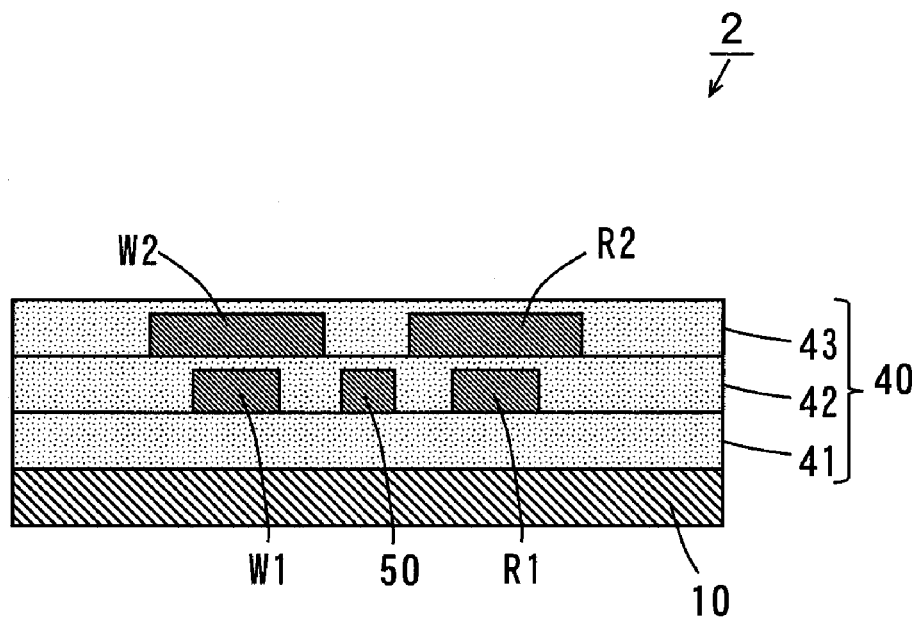
FIG. 5 is a sectional view showing a suspension board according to a second embodiment of the present invention.
Figure 6:
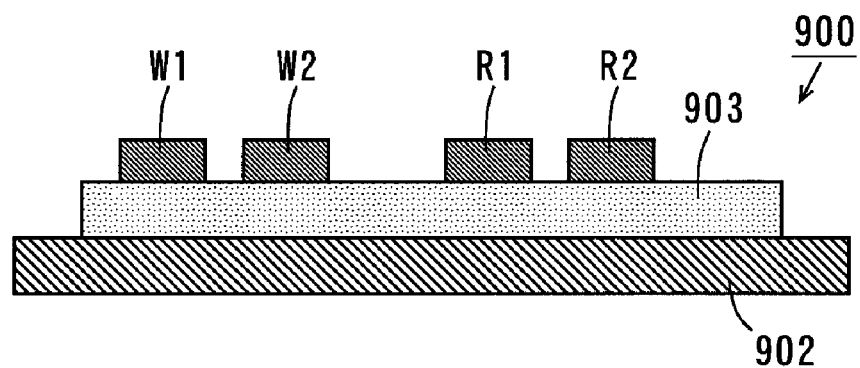
FIG. 6 is a vertical sectional view showing one example of a conventional suspension board.
Figure 7:
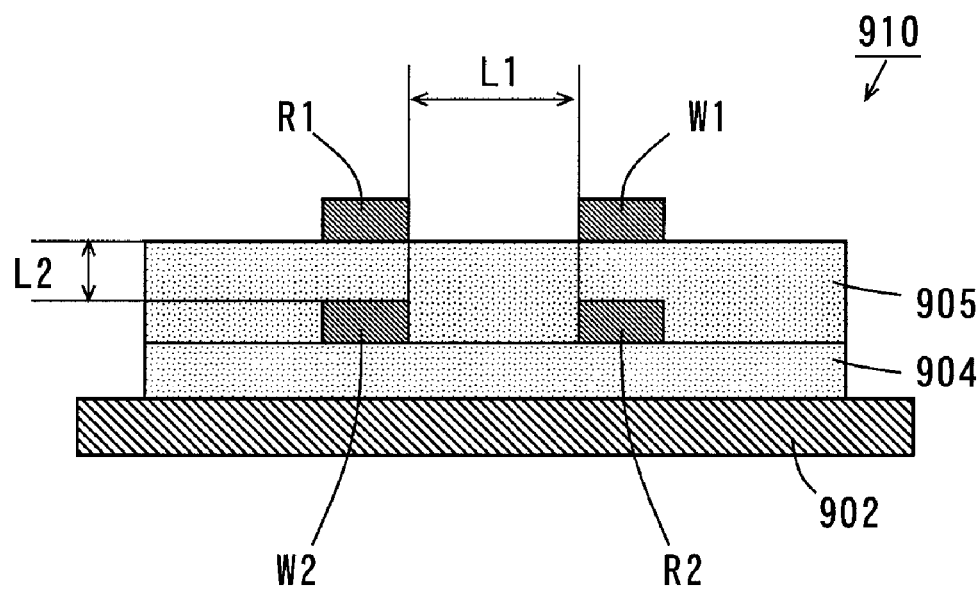
FIG. 7 is a vertical sectional view showing another example of the conventional suspension board.

FIG. 5 is a sectional view of the suspension board 2 according to the second embodiment.

As shown in FIG. 5, an auxiliary wiring trace 50 is provided between the write wiring trace W1 and the read wiring trace R1 on the first insulating layer 41 in the present embodiment.

In this case, an upper surface of a region, between the write wiring trace W1 and the read wiring trace R1, of the second insulating layer 42 can be prevented from bending in a concave shape at the time of formation of the second insulating layer 42. This prevents generation of defects in the write wiring trace W2 and the read wiring trace R2 at the time of formation of the write wiring trace W2 and the read wiring trace R2 on the second insulating layer 42. As a result, the yield of the suspension board 2 can be improved.

Note that the auxiliary wiring trace 50 is preferably formed on the median line centered between the write wiring trace W1 and the read wiring trace R1. The auxiliary wiring trace 50 can be formed using the same material as that of the wiring traces W1, W2, R1, R2.

CORRESPONDENCES BETWEEN ELEMENTS IN THE CLAIMS AND PARTS IN EMBODIMENTS

In the following paragraph, non-limiting examples of correspondences between various elements recited in the claims below and those described above with respect to various preferred embodiments of the present invention are explained.

In the above-described embodiments, the suspension body 10 is an example of a conductive substrate, the write wiring trace W1 or the read wiring trace R1 is an example of a first or third wiring trace, the write wiring trace W2 or the read wiring trace R2 is an example of a second or fourth wiring trace, the auxiliary wiring trace 50 is an example of a fifth wiring trace, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A printed circuit board comprising:
a conductive substrate;
a first insulating layer formed on said conductive substrate;
a first wiring trace formed on said first insulating layer;
a second insulating layer formed on said first insulating layer to cover said first wiring trace;
a second wiring trace formed on said second insulating layer; and
a third insulating layer formed on said second insulating layer to cover said second wiring trace, wherein said first and second wiring traces constitute a first signal line pair, and wherein a width of the second wiring trace is larger than a width of the first wiring trace to set an impedance of said first wiring trace and an impedance of said second wiring trace to be substantially equal to each other.

2. The printed circuit board according to claim 1, further comprising
a third wiring trace formed on said first insulating layer at a distance from said first wiring trace, and
a fourth wiring trace formed on said second insulating layer at a distance from said second wiring trace, wherein
said third and fourth wiring traces constitute a second signal line pair, and
a width of said fourth wiring trace is larger than a width of said third wiring trace.

3. The printed circuit board according to claim 1, wherein the first and second wiring traces are spaced apart about 1 to 5 μm.

4. The printed circuit board according to claim 2, wherein the widths of said third and fourth wiring traces are set such that an impedance of said third wiring trace and an impedance of said fourth wiring trace are substantially equal to each other.

5. The printed circuit board according to claim 2, further comprising a fifth wiring trace formed between said first wiring trace and said third wiring trace on said first insulating layer.

6. The printed circuit board according to claim 2, further comprising a head that is provided in said conductive substrate and reads/writes a signal, wherein said first, second, third and fourth wiring traces are electrically connected to said head.

7. The printed circuit board according to claim 2, wherein the first and third wiring traces are spaced apart about 10 to 60 μm.

8. A suspension board for an actuator of a hard disk drive comprising:
a suspension body;
a first insulating layer formed on the suspension body;
a first wiring trace formed on the first insulating layer at a first distance from the suspension body;
a second insulating layer formed on the first insulating layer so as to cover the first wiring trace;
a second wiring trace formed on the second insulating layer at a second distance from the suspension body, wherein the second wiring trace is positioned above and centered with the first wiring trace; and
a third insulating layer formed on the second insulating layer so as to cover the second wiring trace,
wherein the first and second wiring traces constitute a first signal line pair, and
wherein a width of the second wiring trace is larger than a width of the first wiring trace to set an impedance of the first wiring trace and an impedance of the second wiring trace to be substantially equal to each other.

9. The suspension board of claim 8, further comprising:
a third wiring trace formed on the first insulating layer at a distance from the first wiring trace and at the first distance from the suspension body; and
a fourth wiring trace formed on the second insulating layer at a distance from the second wiring trace and at the second distance from the suspension body, wherein the fourth wiring trace is positioned above and centered with the third wiring trace,
wherein the third and fourth wiring traces constitute a second signal line pair; and
wherein a width of the fourth wiring trace is larger than a width of the third wiring trace.

10. The suspension board of claim 9, wherein the widths of the third and fourth wiring traces are set such that an impedance of the third wiring trace and an impedance of the fourth wiring trace are substantially equal to each other.

11. The suspension board of claim 9, further comprising a fifth wiring trace formed between the first wiring trace and the third wiring trace on the first insulating layer.

12. The suspension board of claim 9, further comprising a head that is provided in the suspension body, and reads and writes a signal, and wherein the first, second, third and fourth wiring traces are electrically connected to the head.

* * * * *